(12) United States Patent
Cramer et al.

(10) Patent No.: US 10,732,514 B2
(45) Date of Patent: Aug. 4, 2020

(54) METROLOGY METHOD AND APPARATUS WITH INCREASED BANDWIDTH

(71) Applicant: ASML Netherlands B.V., Veldhoven (NL)

(72) Inventors: Hugo Augustinus Joseph Cramer, Eindhoven (NL); Seyed Iman Mossavat, Waalre (NL); Paul Christiaan Hinnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/264,755

(22) Filed: Feb. 1, 2019

(65) Prior Publication Data
US 2019/0258177 A1 Aug. 22, 2019

(30) Foreign Application Priority Data
Feb. 20, 2018 (EP) .................................... 18157680

(51) Int. Cl.
*G03F 7/20* (2006.01)
*G02B 21/10* (2006.01)
(Continued)

(52) U.S. Cl.
CPC ....... *G03F 7/70591* (2013.01); *G01N 21/274* (2013.01); *G02B 21/10* (2013.01); *G02B 21/361* (2013.01); *G03F 7/70633* (2013.01)

(58) Field of Classification Search
CPC ........... G01N 21/255; G01N 2021/399; G01N 21/39; G01N 21/8851; G01N 2201/061; G01N 15/0205; G01N 2201/0612; G01N 15/0211; G01N 21/31; G01N 21/8806; G01N 2201/06113; G01N 2201/0627;
(Continued)

(56) References Cited

U.S. PATENT DOCUMENTS 10,416,566 B2 9/2019 Conley et al.
2007/0023734 A1 2/2007 Igarashi et al.
(Continued)

FOREIGN PATENT DOCUMENTS

TW 201732419 A 9/2017
WO WO 2017/153130 A1 9/2017

OTHER PUBLICATIONS

European Search Report from related European Patent Application No. EP 18157680, completed Jul. 27, 2018; 10 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Disclosed is method of optimizing bandwidth of measurement illumination for a measurement application, and an associated metrology apparatus. The method comprises performing a reference measurement with reference measurement illumination having a reference bandwidth and performing one or more optimization measurements, each of said one or more optimization measurements being performed with measurement illumination having a varied candidate bandwidth. The one or more optimization measurements are compared with the reference measurement; and an optimal bandwidth for the measurement application is selected based on the comparison.

15 Claims, 3 Drawing Sheets

(51) Int. Cl.
*G01N 21/27* (2006.01)
*G02B 21/36* (2006.01)

(58) Field of Classification Search
CPC ..... G01N 2201/088; G01N 2021/4783; G01N 21/43; G01J 3/10; G01J 3/108; G01J 3/28; G01J 3/36; G01J 5/10; G01J 2003/1226; G01J 2003/123; G01J 2003/1239; G01J 3/0229; G01J 3/12; G01J 3/26; G01J 3/2803; G01J 3/45; G01J 3/50; G01J 3/51; G01J 3/524; G01J 1/0492; G01J 1/1626; G01J 2001/442; G01J 2001/444; G01J 2003/102; G01J 2003/104; G01J 2003/2826; G01J 2003/2853; G01J 2003/423; G01J 2003/4332; G01J 3/0237; G01J 3/027; G01J 3/0275; G01J 3/0289; G01J 3/0297; G01J 3/2823; G01J 3/4338; G01J 3/4412; G01J 3/443; G01J 3/447; G01J 3/505; G01J 3/506; G01J 3/513; G01B 9/04
See application file for complete search history.

(56) References Cited

U.S. PATENT DOCUMENTS

2007/0133086 A1   6/2007   Wilhelm et al.
2014/0340682 A1   11/2014  Kwak et al.
2017/0082932 A1   3/2017   Fu et al.

OTHER PUBLICATIONS

International Search Report and Written Opinion of the International Searching Authority directed to related International Patent Application No. PCT/EP2019/051777, dated May 7, 2019; 16 pages.

Taiwanese Office Action with English-language Translation attached directed to related Taiwanese Patent Application No. 108105381, dated Feb. 10, 2020; 9 pages.

METROLOGY METHOD AND APPARATUS WITH INCREASED BANDWIDTH

BACKGROUND

Field of the Invention

The present invention relates to methods and apparatus of lithography usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

For various reasons, e.g., to maximize space on the wafer, targets are becoming increasingly smaller. As targets shrink, it is becoming difficult to ensure sufficient illumination (e.g., number of photons per measurement) to ensure good measurement quality and signal-to-noise characteristics. The smaller the targets, the fewer photons there will be incident on the target per second, and as such measurement time increases. It is desirable to reduce this measurement time and/or address one of the aforementioned issues.

SUMMARY OF THE INVENTION

The invention in a first aspect provides a method of optimizing bandwidth of measurement illumination for a measurement application, said method comprising: performing a reference measurement with reference measurement illumination having a reference bandwidth; performing one or more optimization measurements, each of said one or more optimization measurements being performed with measurement illumination having a varied candidate bandwidth; comparing said one or more optimization measurements with said reference measurement; and selecting an optimal bandwidth for the measurement application based on said comparison.

The invention in a second aspect provides a method of performing a measurement using measurement illumination in a measurement application, said method comprising optimizing bandwidth of the measurement illumination for said measurement application.

The invention further provides for a metrology apparatus comprising: an illumination source operable to provide measurement illumination; and a processor operable to optimize bandwidth of the measurement illumination for each measurement application.

The invention further provides for a metrology apparatus and non-transitory computer program product for performing the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
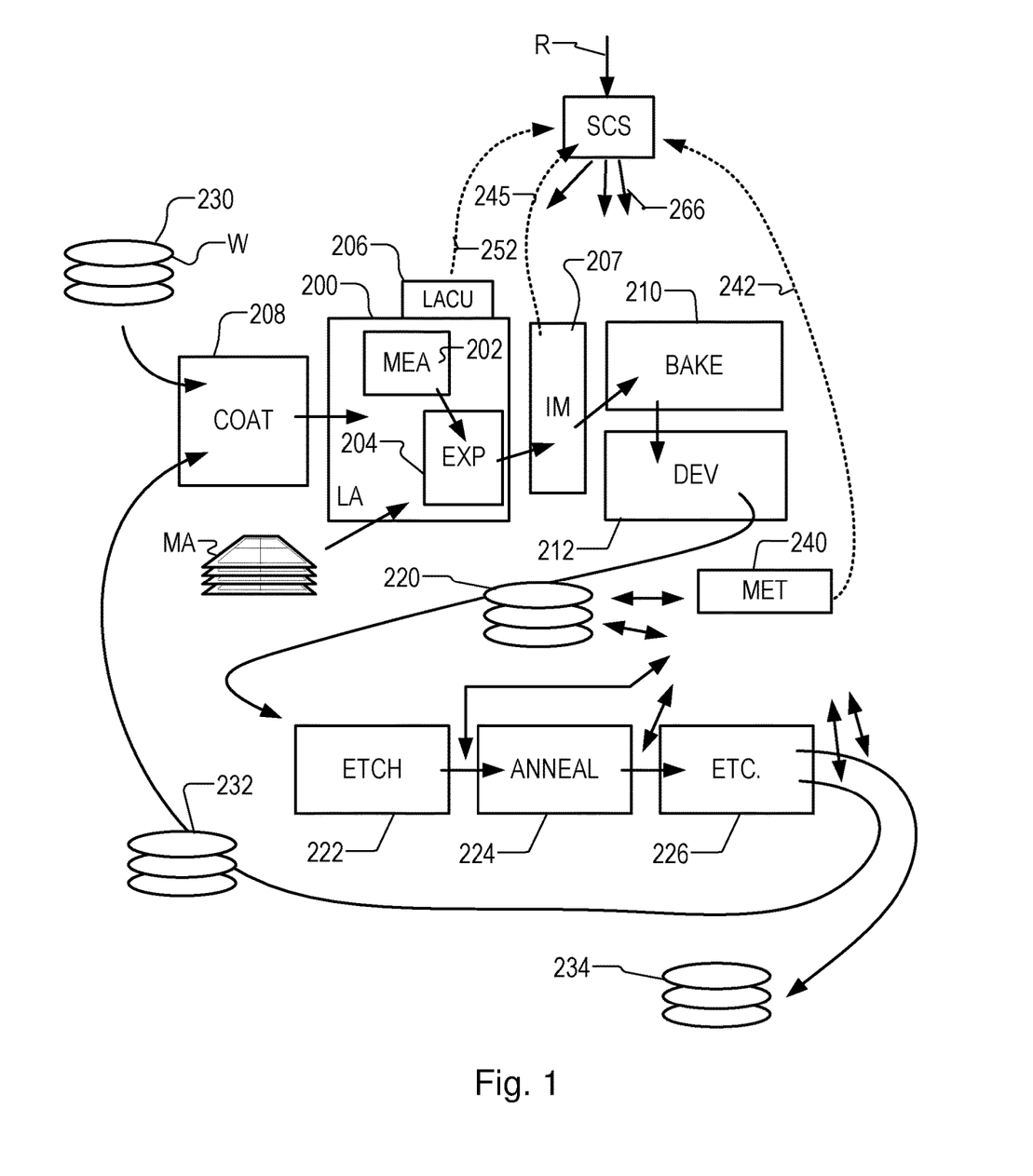
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2A:
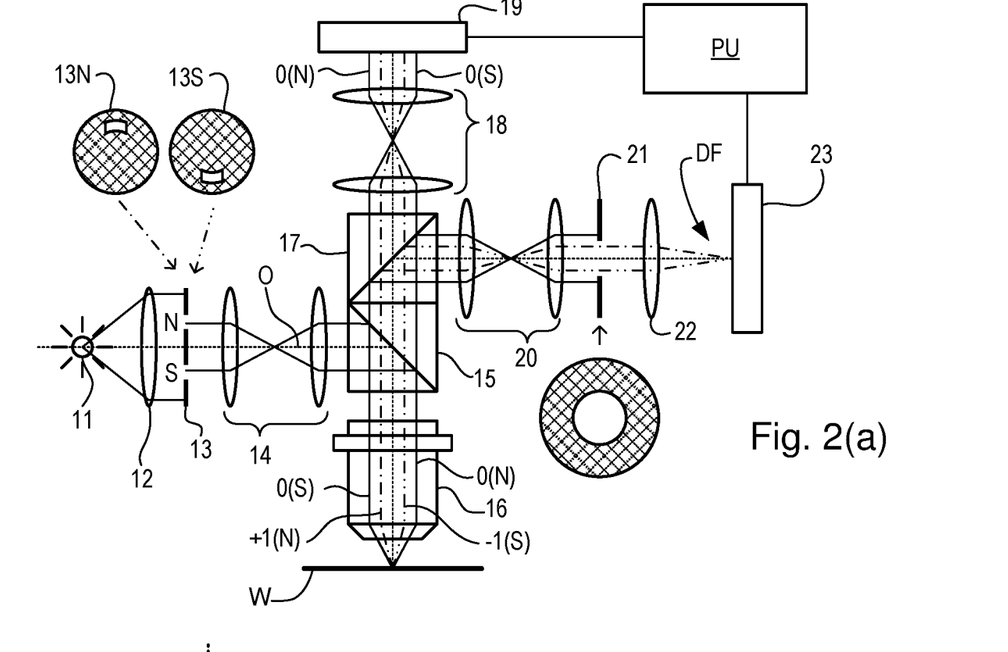
FIGS. 2(a)-2(b) comprise 2(a) a schematic diagram of a dark field scatterometer for use in measuring targets using a first pair of illumination apertures, 2(b) a detail of diffraction spectrum of a target grating for a given direction of illumination.

A metrology apparatus is shown in FIG. 2(a). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 2B:
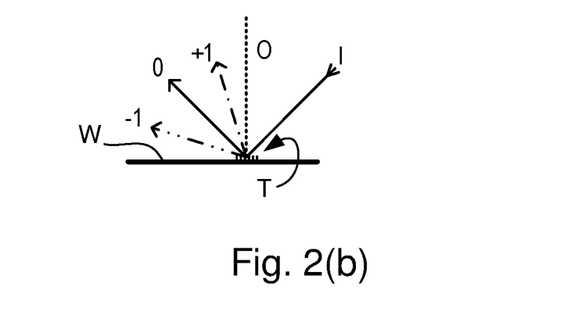

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

In some cases, a metrology apparatus may allow selection of the wavelength(s) and/or bandwidth of the measurement radiation. This facility is typically used to optimize the wavelength used to increase measurement sensitivity, as measurement sensitivity typically varies with wavelength on a stack-by-stack basis (often referred to as a swing curve). Typically, the bandwidth of the measurement radiation is maintained fairly or very narrow. Broader bandwidths are known to have an adverse effect on the measurement quality and therefore a negative impact on the measurement accuracy.

Metrology is being typically performed on targets which are decreasing in size; e.g., to 10 μm by 10 μm or 5 μm by 5 μm (or even smaller). This may be done for a number of reasons, for example, so that the targets can be positioned in amongst product features, rather than in the scribe lane and to minimize the area they occupy on a reticle or wafer. Such targets can be larger (underfilled measurement) or smaller (overfilled measurement) than the illumination spot and may be surrounded by product structures on a wafer. Such targets can comprise multiple gratings which can be measured in one image. However, as targets decrease in size, throughput becomes an issue. The time it takes to perform a complete measurement is often referred to as the move-acquire-measure (MAM) time. The acquisition part of this MAM time will depend on, inter alia, the number of photons per second (photon rate) incident on the target (in addition to other parameters such as the transmission of the sensor and diffraction efficiency of the grating). As target size decreases (e.g., to 5 μm$^2$ or smaller), the photon rate also decreases, all else being equal (e.g., for a given illumination intensity and bandwidth), because an increasingly small illumination spot is used to fit within the small targets. In a typical arrangement, to achieve sufficient signal-to-noise characteristics in the pupil image, the number of photons available for a measurement may be increased by increasing the integration time, leading to higher MAM time and lower throughput.

Methods to address this issue may comprise increasing the overall intensity (brightness) of the source, improved transmission of the optics directing the measurement radiation to and from the target, or increasing the camera efficiency. However, none of these solutions are simple or trivial to implement, as they require significant expenditure and hardware change.

Therefore it is proposed to increase the photons available for a measurement (photon rate) by increasing the bandwidth of the measurement radiation. However, as already mentioned, increased bandwidth radiation may have an adverse effect on the measurement quality. In addition to this, the degree to which the increased bandwidth affects the measurement quality depends on the application; e.g., the structure/target/stack properties being measured. As such, it is not recommended to simply increase the bandwidth without assessing the impact of the increased bandwidth on the measurement.

It is therefore proposed to optimize bandwidth of measurement radiation used in a measurement for each application. In this regard, a different application may refer to a different one or more of, for example:
  the type of measurement performed,
  the type of measurement apparatus used,
  the actual measurement apparatus used (e.g., of a particular type; for example, the actual scanner within a fabrication site comprising multiple scanners),
  the type of target or structure being measured,
  properties of the stack being measured,
  the position of the target on the substrate,
  the measurement algorithm used to calculate a parameter of interest from the detected radiation,
  any other measurement radiation parameter (e.g., central wavelength, polarization, intensity, angle of incidence with respect to the substrate).

This ability to select bandwidth (and possibly wavelength) may be implemented as part of the illumination source. For example, a measurement apparatus may be provided with radiation source which allows selection of bandwidth around a chosen (and selectable) central wavelength. In an alternative arrangement, WO 2017/153130 (incorporated herein by reference) describes a filter arrangement enabling bandwidth selection using a combination of two edge-pass LVFs, one long wave pass LVF and one short wave pass LVF, to create a tunable pass band. Such a filter arrangement may be used with a multiple wavelength source, for example, a white light or multiple wavelength source comprising a continuous spectrum of wavelengths.

By moving both filters together, the central wavelength can be continuously adjusted and by moving the filters relative to one another the bandwidth of the combined filter can also be tuned. Either one of these metrology arrangements, or any other arrangement which enables selection/optimization of bandwidth, is usable in methods described herein.

The main benefit of optimizing bandwidth of measurement radiation per application is that there is a potential benefit in the MAM time and therefore throughput. This is particularly the case for applications where measurement quality is less sensitive to increased bandwidth. The optimization may be based on one or more of a number of criteria. A main objective is to increase bandwidth as much as possible while maintaining measurement quality at an acceptable level, therefore restricting the impact of the increased bandwidth.

The proposed concept may comprise a bandwidth optimization stage. The bandwidth optimization stage may comprise evaluating the bandwidth impact, where the bandwidth impact is the impact on the measurement (e.g., measurement quality and/or value) of using broader bandwidth illumination for a measurement compared to using a narrower, reference bandwidth (e.g., a bandwidth typically used presently, or narrower). In specific embodiments, the reference bandwidth may be defined as a bandwidth narrower than 15 nm, a bandwidth narrower than 10 nm, a bandwidth narrower than 5 nm, or a bandwidth in the range of 5 nm to 15 nm. In specific embodiments, the broader bandwidth used for illumination may be a bandwidth broader than 10 nm (assuming that the reference bandwidth is narrower than 10 nm), a bandwidth broader than 15 nm, a bandwidth broader than 20 nm, a bandwidth broader than 30 nm, or a bandwidth in the range of 20 nm to 50 nm.

In an embodiment, a method may comprising evaluating a bandwidth impact of using illumination having a number of broader bandwidths with respect to using illumination having the reference bandwidth, on a measurement. The broadest bandwidth for which the bandwidth impact is acceptable, e.g., for which the bandwidth impact meets a key performance indicator (KPI), may then be chosen. One KPI may be a rejection threshold value, such that only bandwidth impact values that are below the rejection threshold value are considered acceptable. Each bandwidth impact value may comprise the difference between the measured value using the corresponding broader bandwidth radiation and the measured value using the reference bandwidth radiation. In such an embodiment, the rejection threshold value may comprise a rejection threshold difference.

More specifically, such a method may comprise performing the same measurement with radiation of increasing bandwidth until the bandwidth impact value exceeds the rejection threshold value. The bandwidth relating to the measurement immediately before the rejection threshold value was exceeded can then be selected as the optimized bandwidth for performing measurements for that particular application.

The bandwidth impact may be evaluated in a number of ways. One method for evaluating the bandwidth impact may comprise comparing the differences in the raw or filtered (e.g., z-filtered) detected images (e.g., pupil plane images or image plane images depending on the metrology method) between measurements performed using broader bandwidth illumination and measurements performed using the reference bandwidth illumination. In such an embodiment, the bandwidth of the broader bandwidth illumination may be increased, and a corresponding difference value obtained for a detected image with respect to a reference image (corresponding to the reference bandwidth), until the difference exceeds a threshold difference.

Alternatively, the comparison may be performed on parameter values determined from the detected images. For example, a change in measured parameter values (each corresponding to a broader bandwidth being evaluated) with respect to a reference parameter value (corresponding to the reference bandwidth), may be compared to a threshold parameter value change in a manner otherwise similar to the image comparison. Purely by way of example, the measured parameter value may be overlay, focus, dose, critical dimension or side wall angle etc.

In another embodiment, a global comparison may be made over a set of measurements (e.g., a fingerprint comparison which compares a broader bandwidth fingerprint to a reference (narrowband) fingerprint). For example a point-to-point comparison between different first sets of measurements (each corresponding to a broader bandwidth being evaluated) with respect to a reference set of measurements (corresponding to the reference bandwidth and measured at the same locations as the first set of measurements) may be made to obtain a difference map (bandwidth impact map) for each broader bandwidth being evaluated. Such a comparison may be, for example, per substrate, per field or per region (e.g., substrate edge versus substrate center and possibly also including one or more intermediate regions) so as to obtain, respectively a cross-substrate bandwidth impact map, cross-field bandwidth impact map or cross-region bandwidth impact map. The optimization may be such that a point-to-point comparison assesses the bandwidth impact for each point with respect to other points, rather than the overall bandwidth impact. This is because, for some applications, it may be that a uniform impact (e.g., point-to-point difference) across-substrate (or across-field/region) is more acceptable than a non-uniform impact which affects each point differently. As such, a comparison may comprise a variation metric comparison, such a standard deviation (e.g., 36) comparison. In a similar method as already described, this embodiment may comprise determining whether the variation metric for each bandwidth impact map exceeds a threshold value and choosing the broadest bandwidth corresponding to a bandwidth impact map which does not exceed the threshold value.

Optionally, in addition to optimizing the bandwidth to minimize the impact of a broader bandwidth on the measurement, it is proposed that the measurement determination (i.e., the measurement calculation or algorithm used) takes into account the impact of the broader bandwidth. In this way, the impact of the broader bandwidth may be reduced further and/or corrected for. Alternatively, or in addition, such methods may provide further scope for increasing the bandwidth in the bandwidth optimization stage. For example, reducing the actual impact of a broader bandwidth may allow the rejection threshold value to be raised, thereby allowing an even broader bandwidth to be used during measurement.

One embodiment for accounting for the bandwidth impact may comprise using reference data relating to (at least one) narrow reference bandwidth to train a measurement algorithm to account for the bandwidth impact. Any suitable machine learning technique may be used for the training (e.g., a suitable regression analysis). The reference data could be linked to corresponding broader bandwidth measurements. The relationship between the reference data and the broader bandwidth measurements can then be learnt. Then, during an actual measurement (e.g., in a production setting) this relationship (and a correction based thereon)

can be applied to the broader bandwidth measurement actually performed, to mitigate for the effect of the broader bandwidth; i.e., to bring the measured value closer to that which would have been observed had narrowband radiation been used.

In another embodiment, more specifically where the measurements are model based (e.g., measurement using reconstruction techniques), accounting for the bandwidth impact may comprise taking into account the bandwidth in the simulation of modelled responses (e.g., modelled diffraction patterns, modelled pupils etc.). Such model based measurements are well known and may comprise modelling a structure being measured in terms of a number of parameters (e.g., some fixed and some variable) and modelling the response (i.e., the detected intensity pattern). This modelled response can then be compared to the actual detected intensity pattern, with one or more of the variable parameters varied to minimize the difference between the measured and modelled response. The parameter values when the difference is minimal may be taken to be the actual values of the measured structure. If the model accounts for the (broader) bandwidth of the measurement radiation actually used in the measurement, a more accurate reconstruction can be performed. In an embodiment, to simplify and speed up the simulation, the finite bandwidth multiband (e.g., continuous) radiation may be approximated by measurement radiation comprising two or more narrowband radiation sources extending over the range of the actual bandwidth of the measurement radiation. Narrowband, within this specific context, may mean being no broader than 10 nm or no broader than 5 nm. As such, measurement radiation comprising a continuous band of 700-730 nm, may be approximated to two narrowband sources at 700 nm and 730 nm. In an embodiment, the actual (e.g., two) wavelengths selected to approximate a continuous wavelength band will depend also on the shape of the continuous wavelength band.

Figure 3:
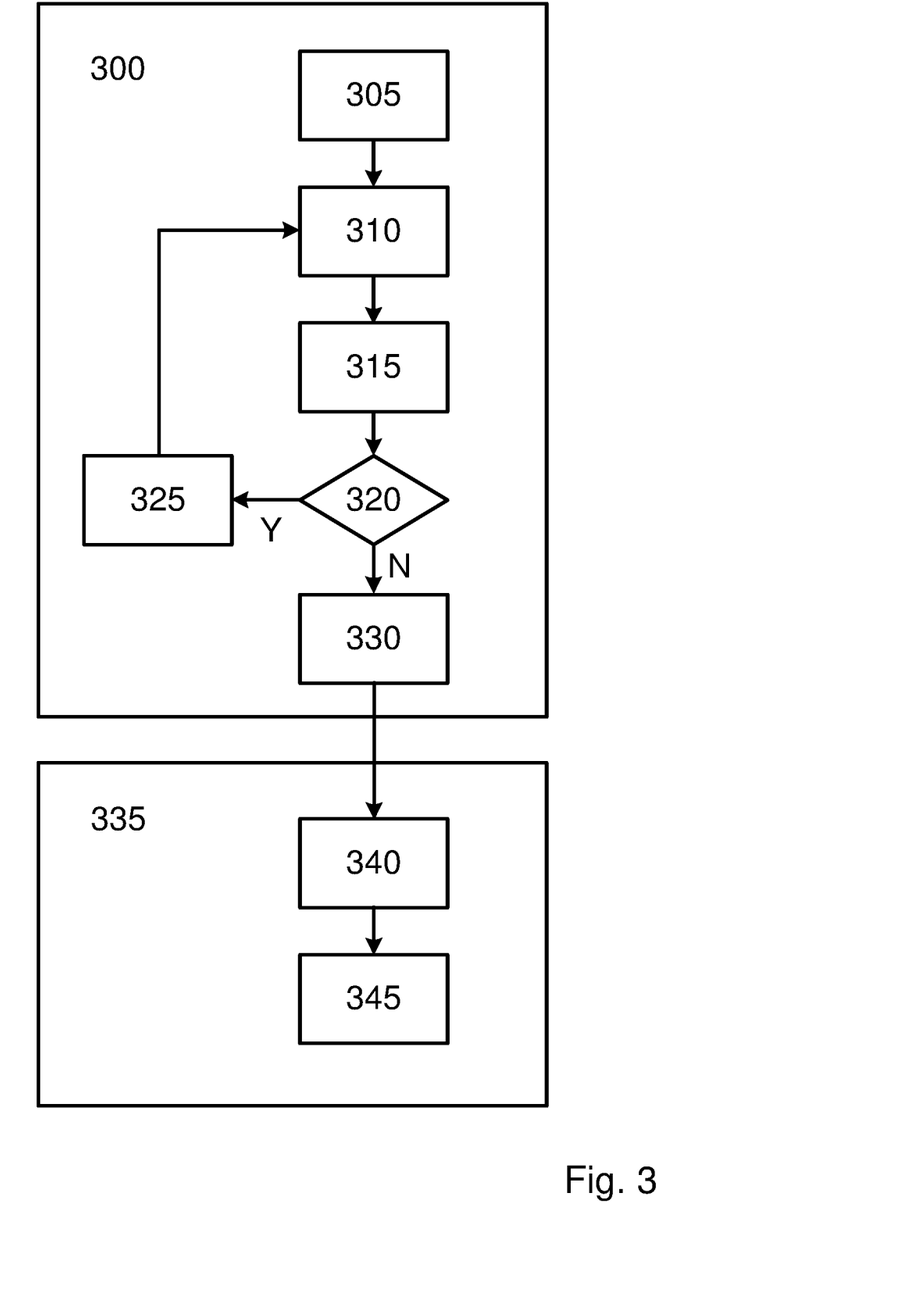
FIG. 3 is a flowchart describing a method according to an embodiment of the invention.

FIG. 3 is a flowchart describing a method according to an embodiment. In a bandwidth optimization stage 300, at least one reference measurement of a structure may be made 305 using radiation having a reference (e.g., narrow) bandwidth. At step 310, a further measurement of the structure is made using radiation having a broader bandwidth than the reference bandwidth. At step 315, the bandwidth impact is determined, e.g., as a measure of the difference between the reference measurement made at step 305 and the measurement made at step 310. At step 320, it is determined whether the bandwidth impact exceeds a rejection threshold value. If no, the bandwidth is increased further (step 325) and steps 310 to 320 are repeated until the bandwidth impact exceeds the rejection threshold. When this happens, the broadest bandwidth for which the corresponding bandwidth impact did not exceed the rejection threshold value is chosen (step 330) as the optimized bandwidth for that application. Then, in a production stage 335 corresponding to the same application as bandwidth optimization stage 300, a measurement is performed 340 using measurement radiation having the optimized bandwidth chosen at step 330. At step 345 a measurement value is then determined from the measurement performed at step 340. Optionally this determination step 345 may comprise accounting for the bandwidth impact in the calculation of the measurement value.

The methods described herein can result in significantly more photons being incident on a given target in a given timeframe, while maintain an acceptable measurement quality. As such, measurement throughput may be increased compared to performing measurements with narrowband radiation.

Further embodiments according to the invention are described in below numbered clauses:

1. A method of optimizing bandwidth of measurement illumination for a measurement application, said method comprising:
performing a reference measurement with reference measurement illumination having a reference bandwidth;
performing one or more optimization measurements, each of said one or more optimization measurements being performed with measurement illumination having a varied candidate bandwidth;
comparing said one or more optimization measurements with said reference measurement; and
selecting an optimal bandwidth for the measurement application based on said comparison.

2. A method according to clause 1, wherein said comparison step comprises determining a bandwidth impact value for each of said one or more optimization measurements by comparing each of said one or more optimization measurements to said reference measurement.

3. A method according to clause 2, wherein the step of selecting an optimal bandwidth comprises selecting the broadest of said candidate bandwidths for which the bandwidth impact value meets a performance indicator.

4. A method according to clause 3, wherein the performance indicator comprises a rejection threshold value such that said optimal bandwidth corresponds to the broadest candidate bandwidth for which the bandwidth impact value is below the rejection threshold value.

5. A method according to clause 4, wherein said step of performing one or more optimization measurements, and said comparison step are performed such that the varied candidate bandwidth is increased and said comparison made until the bandwidth impact value exceeds the rejection threshold value.

6. A method according to any of clauses 2 to 5, wherein each bandwidth impact value comprises a difference between an optimization measurement and the reference measurement.

7. A method according to any preceding clause, wherein each candidate bandwidth of the varied candidate bandwidth is broader than the reference bandwidth.

8. A method according to any preceding clause, wherein said comparison step comprises comparing detected images obtained from each of said one or more optimization measurements to a detected image obtained during said reference measurement.

9. A method according to any of clauses 1 to 7, wherein said comparison step comprises comparing parameter values calculated from each of said one or more optimization measurements to a parameter value calculated from said reference measurement.

10. A method according to any of clauses 1 to 7, wherein:
said reference measurement comprises a reference set of measurements performed at a number of different locations on a substrate;
each of said one or more optimization measurements comprise an optimization set of measurements performed at said number of different locations on the substrate; and
said comparison step comprises a point-to-point comparison at each of said locations between each of said one or more optimization set of measurements and said reference set of measurements.

11. A method according to clause 10, wherein said locations are distributed over the substrate, over a substrate field or over a substrate region.

12. A method according to clause 10 or 11, wherein said comparison comprises a comparison of a variation metric comparing the amount of variation in each set of measurements being compared.

13. A method according to any preceding clause, comprising the step of performing a measurement with optimal bandwidth measurement illumination having said optimal bandwidth.

14. A method according to clause 13, comprising the further step of:
determining a parameter value for a parameter of interest from said measurement while mitigating for the effect of using said optimal bandwidth measurement illumination with respect to using measurement illumination having the reference bandwidth.

15. A method according to clause 14, wherein said mitigating for the effect of using said optimal bandwidth measurement illumination comprises determining a correction for said parameter value from a determined relationship between measurement data corresponding to said optimal bandwidth and reference data corresponding to said reference bandwidth.

16. A method according to clause 15, wherein said determined relationship has been determined via a machine learning method linking said reference data corresponding to said reference bandwidth with said measurement data corresponding to said optimal bandwidth.

17. A method according to clause 14, wherein said parameter value is determined using a simulated measurement to determine a modeled response, and said mitigating for the effect of using said optimal bandwidth measurement illumination comprises accounting for the effect of the optimal bandwidth measurement illumination on said simulated measurement and modeled response.

18. A method according to clause 17, wherein the effect of the optimal bandwidth in the simulated measurement is approximated by simulating the use of two or more narrowband sources at wavelengths distributed across said optimal bandwidth.

19. A method of performing a measurement using measurement illumination in a measurement application, said method comprising optimizing bandwidth of the measurement illumination for said measurement application.

20. A method according to clause 19 wherein the step of optimizing bandwidth of the measurement illumination comprises performing the method of any of clauses 1 to 18.

21. A metrology apparatus comprising:
an illumination source operable to provide measurement illumination; and a processor operable to optimize bandwidth of the measurement illumination for each measurement application.

22. A metrology apparatus being further operable to perform the method of any of clauses 1 to 18.

23. A metrology apparatus according to clause 21 or 22, further comprising:
a support for a substrate; and an optical system for measuring a structure on said substrate with said measurement illumination.

24. A non-transitory computer program product comprising machine-readable instructions for causing a processor to cause performance of the method of any of clauses 1 to 18.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
performing a reference measurement with reference measurement illumination having a reference bandwidth;
performing one or more optimization measurements, each of the one or more optimization measurements being performed with measurement illumination having a varied candidate bandwidth;
comparing the one or more optimization measurements with the reference measurement, the comparing further including determining a bandwidth impact value on the measurement illumination, the bandwidth impact value relating to a quality metric of the measurement illumination for using the one or more optimization measurements compared with using the reference bandwidth; and
selecting an optimal bandwidth for the measurement application based on the comparison in response to the quality metric being above a predetermined threshold.

2. The method of claim 1, wherein determining the bandwidth impact value for each of the one or more optimization measurements comprises comparing each of the one or more optimization measurements to the reference measurement.

3. The method of claim 2, wherein the selecting comprises selecting the broadest of the candidate bandwidths for which the bandwidth impact value meets a performance indicator.

4. The method of claim 3, wherein the performance indicator comprises a rejection threshold value such that the optimal bandwidth corresponds to the broadest candidate bandwidth for which the bandwidth impact value is below the rejection threshold value.

5. The method of claim 4, wherein the performing one or more optimization measurements and the comparing are performed such that the varied candidate bandwidth is increased and the comparison made until the bandwidth impact value exceeds the rejection threshold value.

6. The method of claim 2, wherein each bandwidth impact value comprises a difference between an optimization measurement and the reference measurement.

7. The method of claim 1, wherein each candidate bandwidth of the varied candidate bandwidth is broader than the reference bandwidth.

8. The method of claim 1, wherein the comparing comprises comparing detected images obtained from each of the one or more optimization measurements to a detected image obtained during the reference measurement.

9. The method of claim 1, wherein the comparing comprises comparing parameter values calculated from each of the one or more optimization measurements to a parameter value calculated from the reference measurement.

10. The method of claim 1, wherein:
the reference measurement comprises a reference set of measurements performed at a number of different locations on a substrate;
each of the one or more optimization measurements comprise an optimization set of measurements performed at the number of different locations on the substrate; and
the comparing comprises a point-to-point comparison at each of the locations between each of the one or more optimization set of measurements and the reference set of measurements.

11. The method of claim 10, wherein the locations are distributed over the substrate, over a substrate field or over a substrate region.

12. The method of claim 10, wherein the comparing comprises a comparison of a variation metric comparing the amount of variation in each set of measurements being compared.

13. The method of claim 1, further comprising:
performing a measurement with optimal bandwidth measurement illumination having the optimal bandwidth.

14. The method of claim 13, further comprising:
determining a parameter value for a parameter of interest from the measurement while mitigating for the effect of using the optimal bandwidth measurement illumination with respect to using measurement illumination having the reference bandwidth.

15. The method of claim 14, wherein the mitigating comprises determining a correction for the parameter value from a determined relationship between measurement data corresponding to the optimal bandwidth and reference data corresponding to the reference bandwidth.

* * * * *